United States Patent
Wise et al.

[11] Patent Number: 6,135,460
[45] Date of Patent: Oct. 24, 2000

[54] METHOD OF AND APPARATUS FOR PURIFYING REDUCED PRESSURE PROCESS CHAMBERS

[75] Inventors: Rick L. Wise; Michael A. Kasner, both of Plano, Tex.

[73] Assignee: Texas Instruments Incorporated, Dallas, Tex.

[21] Appl. No.: 09/124,799

[22] Filed: Jul. 29, 1998

Related U.S. Application Data

[60] Provisional application No. 60/054,363, Jul. 31, 1997.

[51] Int. Cl.⁷ .................................................. B01D 53/04
[52] U.S. Cl. ........................ 277/628; 277/913; 277/918; 277/180; 210/263; 220/304
[58] Field of Search ..................................... 277/913, 929, 277/652, 946, 918; 210/263, 502.1, 282; 220/304

[56] References Cited

U.S. PATENT DOCUMENTS

| | | |
|---|---|---|
| 4,109,922 | 8/1978 | Martin ..................................... 277/180 |
| 4,299,921 | 11/1981 | Youssef .................................... 277/918 |
| 5,360,461 | 11/1994 | Meinzer ....................................... 48/61 |
| 5,538,545 | 7/1996 | Dauber et al. ............................. 96/153 |
| 5,722,668 | 3/1998 | Rice et al. ................................ 277/913 |
| 5,765,838 | 6/1998 | Ueda et al. ............................... 277/650 |
| 5,932,372 | 8/1999 | Rendina .................................. 429/218.1 |
| 5,997,618 | 12/1999 | Schneider et al. ......................... 96/135 |

OTHER PUBLICATIONS

Article from Microcontamination, Aug. 1993, "Point-of-Use Purfiers Improve Quality of CVD-Grown Films" (published by Millipore).

*Primary Examiner*—Anthony Knight
*Assistant Examiner*—Mark Williams
*Attorney, Agent, or Firm*—Jacqueline J. Garner; W. James Brady III; Frederick J. Telecky, Jr.

[57] ABSTRACT

Gas purification resins are encapsulated in deformable, permeable polymer sheaths to form purification rings, gaskets or seals. A primary source of contaminants in advanced vacuum processors equipped with vacuum load-lock systems and process gas purifiers is from the leakage of outside ambient contaminants around O-ring seals. Using gas purification rings, gaskets or seals properly placed inside or outside of the outer O-ring seal, the level of contaminants (particularly hydrocarbons, oxygen and moisture) may be significantly reduced or eliminated. The gas purification ring is preferably a hydrocarbon and/or oxygen and/or moisture absorbing and/or adsorbing material encased within a contaminant permeable casing. The gas purification ring can be round or flattened and is preferably more resilient than the O-rings adjacent thereto which form the seal. An adhesive can be placed around the casing holding the purification resin to prevent movement from its purifying location.

4 Claims, 2 Drawing Sheets

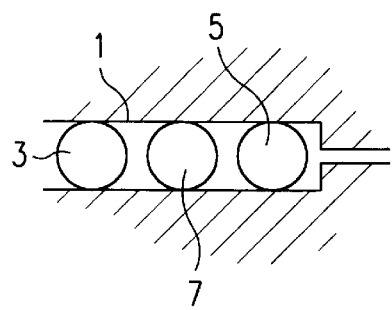
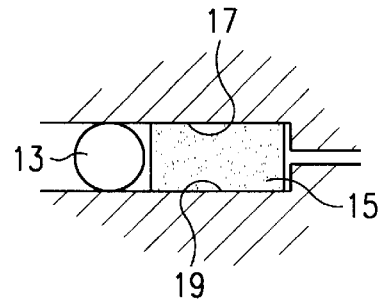
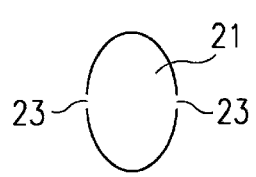
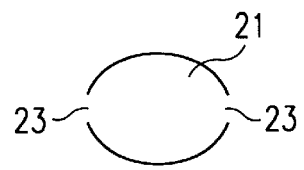
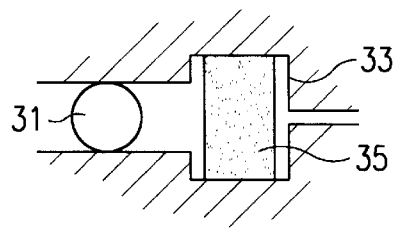
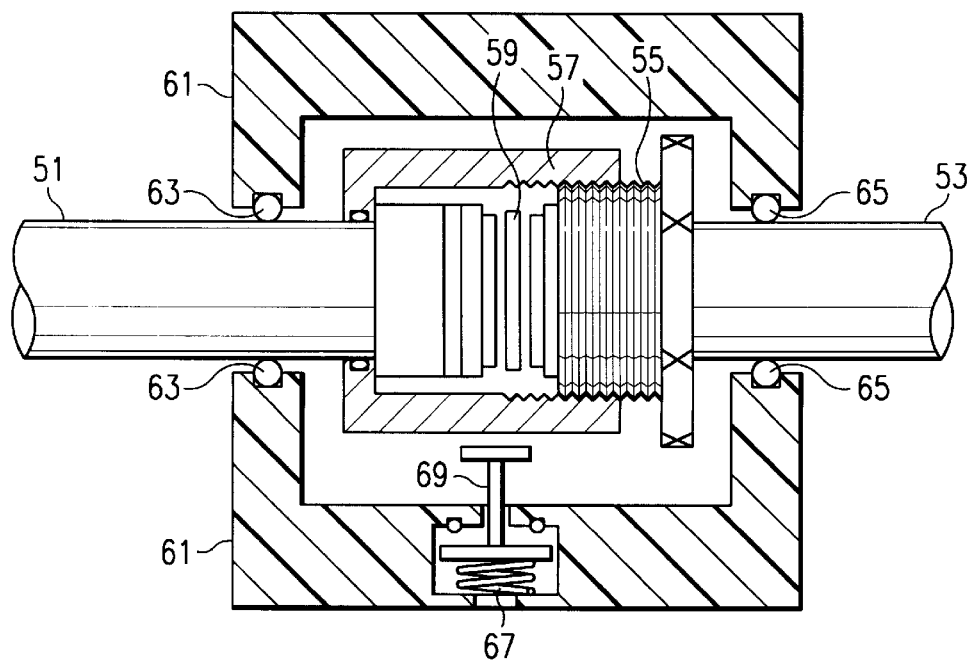

METHOD OF AND APPARATUS FOR PURIFYING REDUCED PRESSURE PROCESS CHAMBERS

This application claims priority under 35 USC § 119 (e) (1) of provisional application Ser. No. 60/054,363, filed Jul. 31, 1997.

BACKGROUND OF THE INVENTION

1. Field of the Invention

This invention relates to a method and apparatus for maintaining the purity of reduced pressure process chambers.

2. Brief Description of the Prior Art

Fabrication processes for semiconductor devices require almost contamination-free conditions. These conditions become continually more stringent with the continued reduction in the geometries of such devices. The prior art has addressed this problem with the advent of gas purifiers, ultra-clean gas cylinder filling technology and the use of welded gas line distribution assemblies, whereby contamination of process chambers used for integrated circuit fabrication by incoming gases has been dramatically reduced (to <5 parts per billion). Another prior art step in process chamber purity has been achieved by the use of vacuum load-lock systems whereby the process chamber is not directly exposed to room ambient. A process chamber may go for weeks or months before it is opened for maintenance using the vacuum load-lock system. However, contamination is still present, even if small, and becomes increasingly significant with the decrease in integrated circuit component geometries.

The present greatest source of impurity introduction into a vacuum load-locked chamber with gas purification systems on the incoming gases appears to be a result of the impurities which leak into the system around the O-ring seals of the vacuum system. When leaks are from the ambient external to the chamber, the contaminant will generally be about twenty percent (20%) oxygen. For many processes, particularly deposition processes in semiconductor fabrication, the oxygen can react with deposition gases, forming oxide particles which may contaminate the wafers or the oxygen may contribute to the formation of a native oxide on the wafer which may be detrimental to the electrical properties of the integrated circuit device being fabricated. It is therefore apparent that an improved system for isolating the processing chamber from the external ambient is required.

SUMMARY OF THE INVENTION

In accordance with the present invention, the above noted problem of the prior art is minimized and there is provided a method of and apparatus for further minimizing the permeation of contaminants and particularly oxygen from the external ambient into the processing chamber in vacuum load-locked systems for semiconductor fabrication.

Briefly, the above is accomplished by providing a resinous substance as is normally used in gas purifiers, such as, for example, organometallic resins such as magnesium hydride and lithium triphenylmethane, and encapsulating this resinous substance in a polymer barrier (such as polytetrafluoroethylene or other suitable material) with a porosity (micropores) to allow the passage of gas therethrough and which can be formed in the shape of an O-ring and placed concentrically between an outer O-ring and an inner O-ring. This purifier ring configuration absorbs or adsorbs some or all of the moisture and oxygen which would otherwise have entered the vacuum chamber by travelling around the O-ring seals as used in the prior art to provide the vacuum conditions within the chamber. In addition, if required, a "filter ring" can be disposed in the path between the purifying ring and the inner O-ring to prevent the purification medium from entering the process chamber. Materials which can be used to provide the filtering action of the filter ring are, for example, but not limited to polytetrafluoroethylene, stainless steel and nickel. Alternatively, the purifier ring can be placed external to the outer O-ring and can be made in the shape of a flat circular seal. The purifier seal, gasket or ring is constructed to be more easily deformable than the O-ring to avoid interference with the seal and sealing operation of the O-ring by not impeding the sealing action of the O-rings with the portion of the chamber impinging thereagainst. Holes in the encapsulating resinous material which holds the purifying resin are preferably smaller than any particle size which might cause concern in the process taking place downstream and are preferably in the range of from about 0.1 micron to 0.05 micron. Such holes can be constructed so that the holes increase in size when the purifier container is flattened during use to prevent expending the purification material when not in use or before installation. As a further alternative, a large cutout region external to the outer O-ring can be provided with the gas purifier composed of the resinous substance in a polymer barrier disposed in the cutout to absorb impurities passing to the outer O-ring. Prior to insertion, the purifier ring is either vacuum sealed or sealed in an inert ambient to minimize absorption and/or adsorption of contaminants and thereby increase its useful life. The purifier ring is periodically discarded after use.

BRIEF DESCRIPTION OF THE DRAWINGS

FIG. 2 is an enlarged view of a cross-section of the O-rings and purifier ring in accordance with a second embodiment of the invention whereby an additional O-ring is disposed between the purifier ring and the external environment;

FIG. 3 is a cross-sectional view of an O-ring and purifier ring in accordance with a third embodiment of the invention;

FIG. 4a is a schematic diagram of a fourth embodiment of a purifier ring in accordance with the present invention in the relaxed condition;

FIG. 4b is a diagram as in FIG. 4a but in the deformed state;

FIG. 5 is a diagram of a further embodiment in accordance with the present invention; and FIG. 6 is a cross sectional view of a further embodiment of the invention wherein resin filled containment is provided around a standard metal gasket face seal fitting.

DESCRIPTION OF THE PREFERRED EMBODIMENTS

Figure 1A:
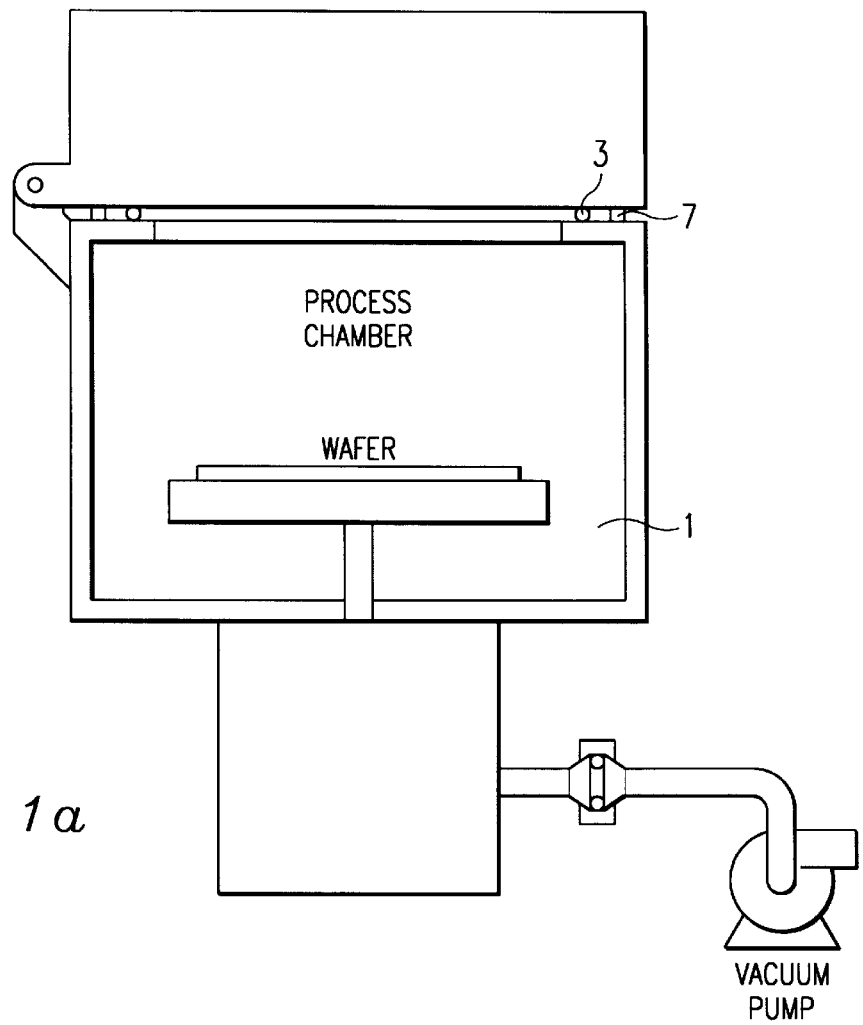
FIGS. 1a and 1b are cross-sectional views of a vacuum processing chamber with O-rings and purifier ring in accordance with a first embodiment of the invention.
Figure 1B:
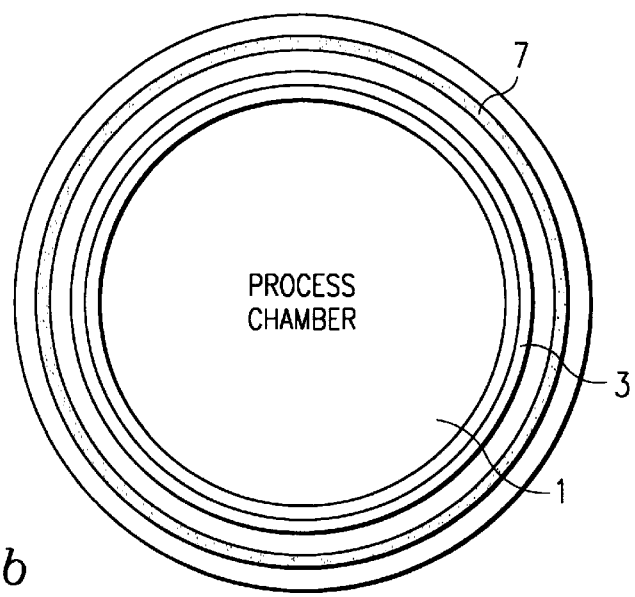

Referring first to FIGS. 1a and 1b, there is shown a vacuum chamber 1 with inner O-ring 3 and purifier ring 7. Without the purifier ring 7, which is the prior art, ambient environment external to the vacuum chamber 1 can seep into the chamber in small but sufficiently significant amounts to hamper production of semiconductor devices, especially those with presently attainable small geometries. The purifier ring 7/O-ring 3 combination removes some or all of the impurities which would otherwise pass into the vacuum chamber 1. The purifier ring 7 is composed of an oxygen and/or moisture absorber and/or adsorber material, preferably an organometallic resin such as magnesium hydride or lithium triphenylmethane, which has been encased with a polytetrafluoroethylene barrier having holes therein with a diameter of about 0.1 micrometer or less. Since the purifier ring 7 is more resilient than the O-ring 3, the purifier ring will tend to flatten slightly when the seal between the O-ring 3 and the chamber 1 is made.

As an alternative and with reference to FIG. 2, a pair of O-rings 3 and 5 can be used in place of the single O-ring 3 of FIGS. 1*a* and 1*b*. The purifier ring 15 can be initially constructed with flat upper and lower surfaces 17 and 19 respectively as shown in FIG. 3 rather than rounded and still extend across the entire passage cross-section due to its greater resiliency relative to the O-ring 13.

Referring now to FIGS. 4*a* and 4*b*, there is shown a further embodiment of the of the barrier formed by the purifier ring 7 or 15 of FIGS. 1*a*, 1*b*, 2 and 3 wherein, in the relaxed condition as shown in FIG. 4*a*, the edges of the holes 23 in the barrier material 21 rest against each other to close the holes and minimize contaminant flow into the oxygen and/or moisture absorber and/or adsorber 25 to improve shelf life of the material 25. Upon deformation of the material 25 by providing a force thereagainst as shown in FIG. 4*b*, the material at the holes is stretched apart to open the holes and permit any contaminant flow to pass through the material 25. Deformation takes place upon insertion in a passage due to the greater resiliency of the barrier material 21 relative to an adjacent O-ring (not shown).

Referring now to FIG. 5, there is shown a further embodiment of the invention wherein the O-ring 31 is disposed toward the chamber interior and the cutout region 33 is external of the O-ring. A purifier ring 35 having rectangular shape with the same construction as in FIG. 3 is disposed within and fills the cutout region 33.

An adhesive can be placed at the portion of the outer surface of the purification member in any of the above described embodiments which will contact the passage, chamber or the like against which it is disposed to provide adhesion and prevent movement of the member from its purification position.

Referring now to FIG. 6, there is shown a further embodiment of the invention wherein resin filled containment is provided around a standard metal gasket face seal fitting. There is shown a pair of pipes 51 and 53, pipe 53 having a threaded end portion 55. A nut 57 is secured to the pipe 53 to permit rotation thereof with a wrench and a threaded member is secured to the pipe 51 for threadedly engaging the threaded end portion 55 of the pipe 53. A deformable seal 59 in the shape of a toroid is positioned to contact the edges of each of the pipes 51 and 53. Upon engagement of the threaded member, the seal 59 will become deformed and act as a gasket between the two pipes 51 and 53. A resin containment member 61 is secured around the connection with a pair of O-rings 63 and 65 providing a sealing action. The resin is the same as that discussed above and has the same properties. Also provided in the resin containment member 61 is a spring loaded sealing mechanism which is biased normally closed by the spring member 67 with the plunger 69 being movable against the spring member to permit movement of gases through the containment member 61.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A seal for a chamber comprising:
   (a) an O-ring; and
   (b) a purification member disposed adjacent said O-ring for absorbing contaminants, wherein said purification member comprises:
   a material taken from the class of organometallic resins; and
   a contaminant permeable casing enclosing said material and having holes thereon with a diameter of up to about 0.1 micrometer;
   (c) said chamber impinging against said O-ring and making a seal therewith and also impinging against said purification member.

2. The seal of claim 1 wherein said O-ring has less resiliency than said purification member.

3. The seal of claim 1 wherein said material is taken from the class consisting of magnesium hydride and lithium triphenylmethane.

4. The seal of claim 1 wherein said contaminant permeable casing is polytetrafluoroethylene.

\* \* \* \* \*